United States Patent
Eaton, Jr.

(10) Patent No.: US 6,661,704 B2
(45) Date of Patent: *Dec. 9, 2003

(54) DIODE DECOUPLED SENSING METHOD AND APPARATUS

(75) Inventor: James R. Eaton, Jr., Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/006,723

(22) Filed: Dec. 10, 2001

(65) Prior Publication Data

US 2003/0107917 A1 Jun. 12, 2003

(51) Int. Cl.$^7$ .......................... G11C 17/14; G11C 8/00; G11C 17/06
(52) U.S. Cl. .................... 365/175; 365/225.7; 365/105; 365/96; 365/243
(58) Field of Search ............................ 365/175, 225.7, 365/105, 96, 243

(56) References Cited

U.S. PATENT DOCUMENTS

| | | | | |
|---|---|---|---|---|
| 4,287,569 A | * | 9/1981 | Fukushima | 365/175 |
| 5,889,694 A | * | 3/1999 | Shepard | 365/105 |
| 5,905,670 A | * | 5/1999 | Babson et al. | 365/105 |

* cited by examiner

*Primary Examiner*—Richard Elms
*Assistant Examiner*—Jung H. Hur (57) ABSTRACT

A method of and apparatus for connecting the sense current line in a cross-point memory array greatly reduces the effect of reverse leakage from unaddressed row or column lines. Separate sense line segments are coupled to separate stripes of row or column lines. Each sense line segment is connected to a sense diode, and each sense diode is connected to a sense bus. Each sense diode provides the current path for sensing on a selected row or column line, while allowing the leakage of only one diode per sense line segment for the unaddressed row or column lines. This arrangement results in wider margins for sensing the state of data cells in a cross-point memory array and simpler circuitry design for the memory array.

20 Claims, 7 Drawing Sheets

DIODE DECOUPLED SENSING METHOD AND APPARATUS

TECHNICAL FIELD

The technical field is digital memory arrays, particularly a method and apparatus for sensing the state of data cells in a digital memory array.

BACKGROUND

Many consumer devices are now constructed to generate and/or use large quantities of digital data. Portable digital cameras for still and/or moving pictures, for example, generate large amounts of digital data representing images. Each digital image may require several megabytes of data storage, and such storage normally must be available in the camera.

Data storage devices comprising cross-point memory arrays are one form of storage applicable for portable devices such as digital cameras. A plurality of the memory arrays may be stacked and laminated into a memory module providing inexpensive, high capacity data storage. The memory module can be employed in an archival data storage system in which the memory module provides a write-once data storage unit receivable in an appliance or interface card.

Cross-point memory arrays comprise sets of transverse electrodes, also known as row and column lines, with memory elements formed at each cross-point of the electrodes. Each memory element can be switched between low and high impedance states, representing binary data states, by application of a write signal in the form of a predetermined current density through the memory element. Each row and column line is coupled to a sensing diode that enables sensing, or reading, of the state of the memory element corresponding to the row or column line. A single sense line spans all of the row or column lines and draws leakage current from all of the sense diodes except for the single sense diode connected to the addressed row or column line. The leakage current flows in a direction opposite to the sense current and can be many times larger than the sense current. Therefore, the leakage current may hide the sense current, making it difficult to accurately sense the state of the addressed memory element.

Therefore, a need exists for a method and apparatus for sensing the state of data cells in a cross-point memory array that reduces the effect of leakage current on the sense current thereby allowing the sense current to be more easily detected.

SUMMARY

A memory storage device comprises a cross-point memory array including a first and second set of transverse electrodes that intersect at a plurality of cross-points. A memory element is located at each cross-point, and each memory element is switchable between a low and a high impedance state. Address decoding circuitry is coupled to the first and second set of transverse electrodes. Striping circuitry is coupled to the first set of transverse electrodes, which are grouped together to form a set of stripes. Each of a plurality of sense line segments is coupled to a separate stripe by a diode, and a sense bus is coupled to each diode.

A memory storage device comprises a cross-point memory array including a first and second set of transverse electrodes that intersect at a plurality of cross-points. A memory element is located at each cross-point, and each memory element is switchable between a low and a high impedance state. Address decoding circuitry is coupled to the first and second set of transverse electrodes. Striping circuitry is coupled to the first set and second set of transverse electrodes, where each set of electrodes is grouped together to form a first and second set of stripes. Each of a plurality of sense line segments is coupled to a separate stripe by a diode. A first sense bus is coupled to each diode that is coupled to the first set of stripes, and a second sense bus is coupled to each diode that is coupled to the second set of stripes.

A method for sensing the state of a memory element in a memory storage device includes the step of coupling striping circuitry to a first set of transverse electrodes, where the first set of transverse electrodes is grouped together to form a set of stripes. The method also includes the steps of generating a current along a selected electrode corresponding to the memory element and detecting whether the current flows in the selected electrode.

DESCRIPTION OF THE DRAWINGS

The detailed description will refer to the following drawings, wherein like numerals refer to like elements, and wherein.

DETAILED DESCRIPTION

Figure 1:
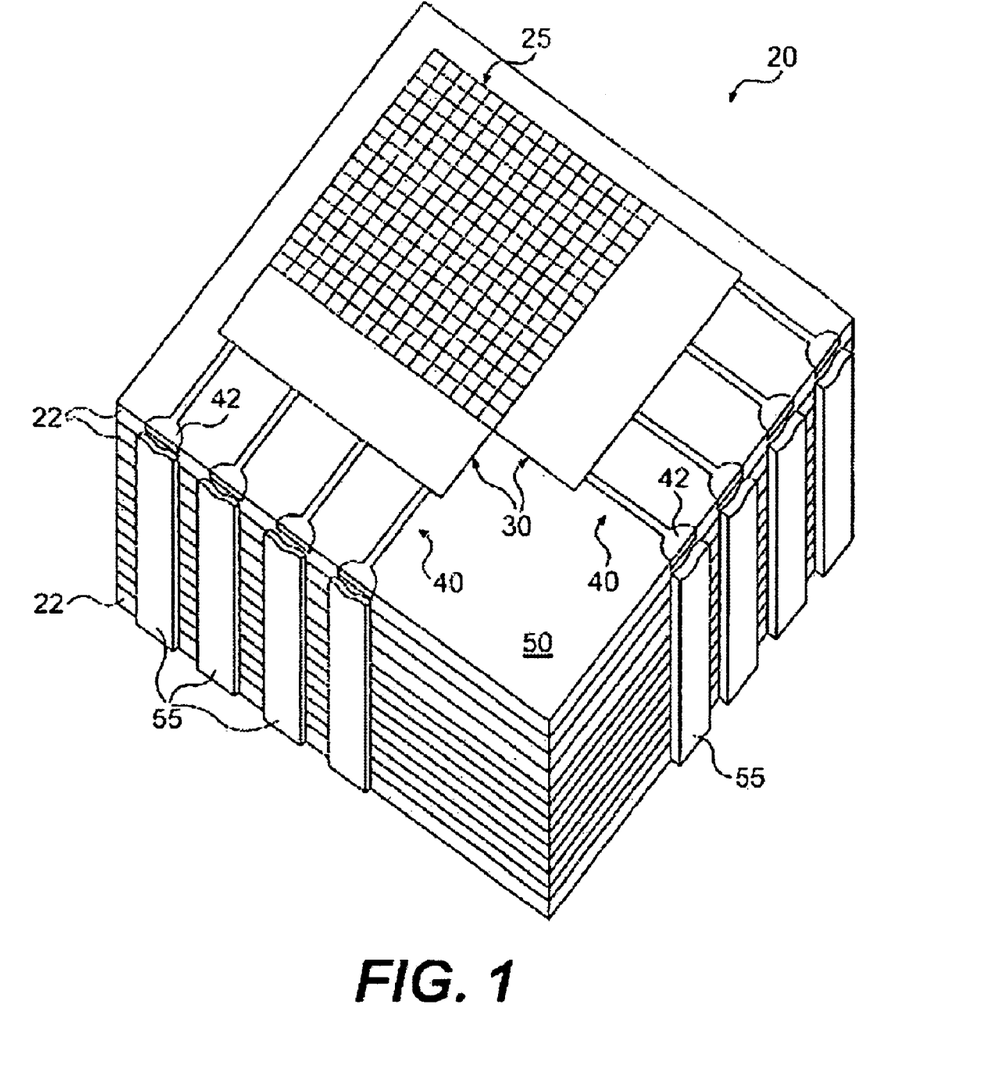
FIG. 1 is a cut-away isometric view of a write-once memory module.
Figure 2:
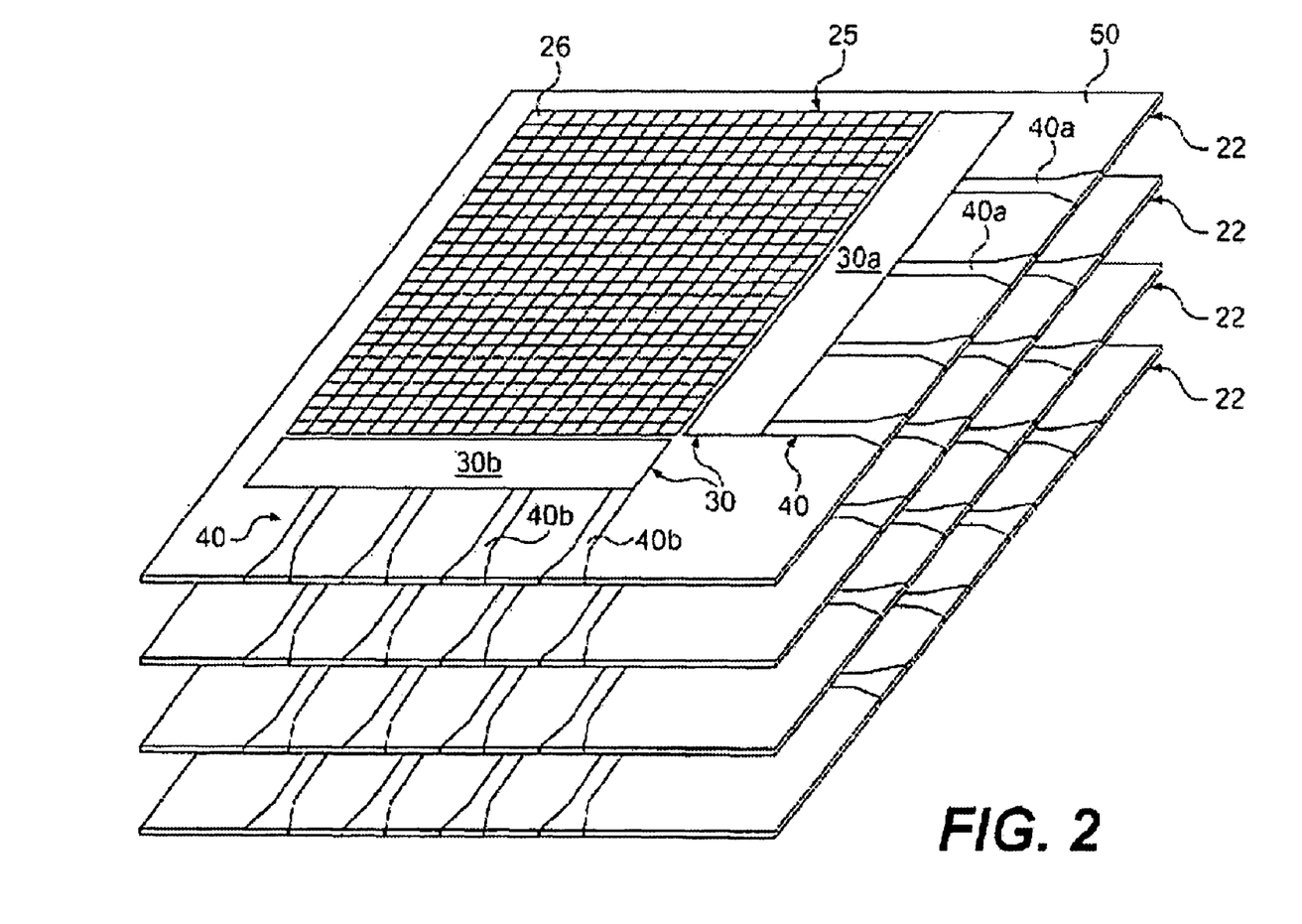
FIG. 2 is an exploded view of layers in the write-once memory module.

Referring to FIGS. 1 and 2, a physical arrangement of a memory module 20 is illustrated. In particular, FIG. 1 is a cut-away isometric view of the memory module 20, and FIG. 2 is an exploded view of several memory module layers 22 of the memory module 20. Additionally, FIG. 3 is a plan view of a memory module layer 22 illustrating an example of the arrangement of components thereon.

Figure 3:
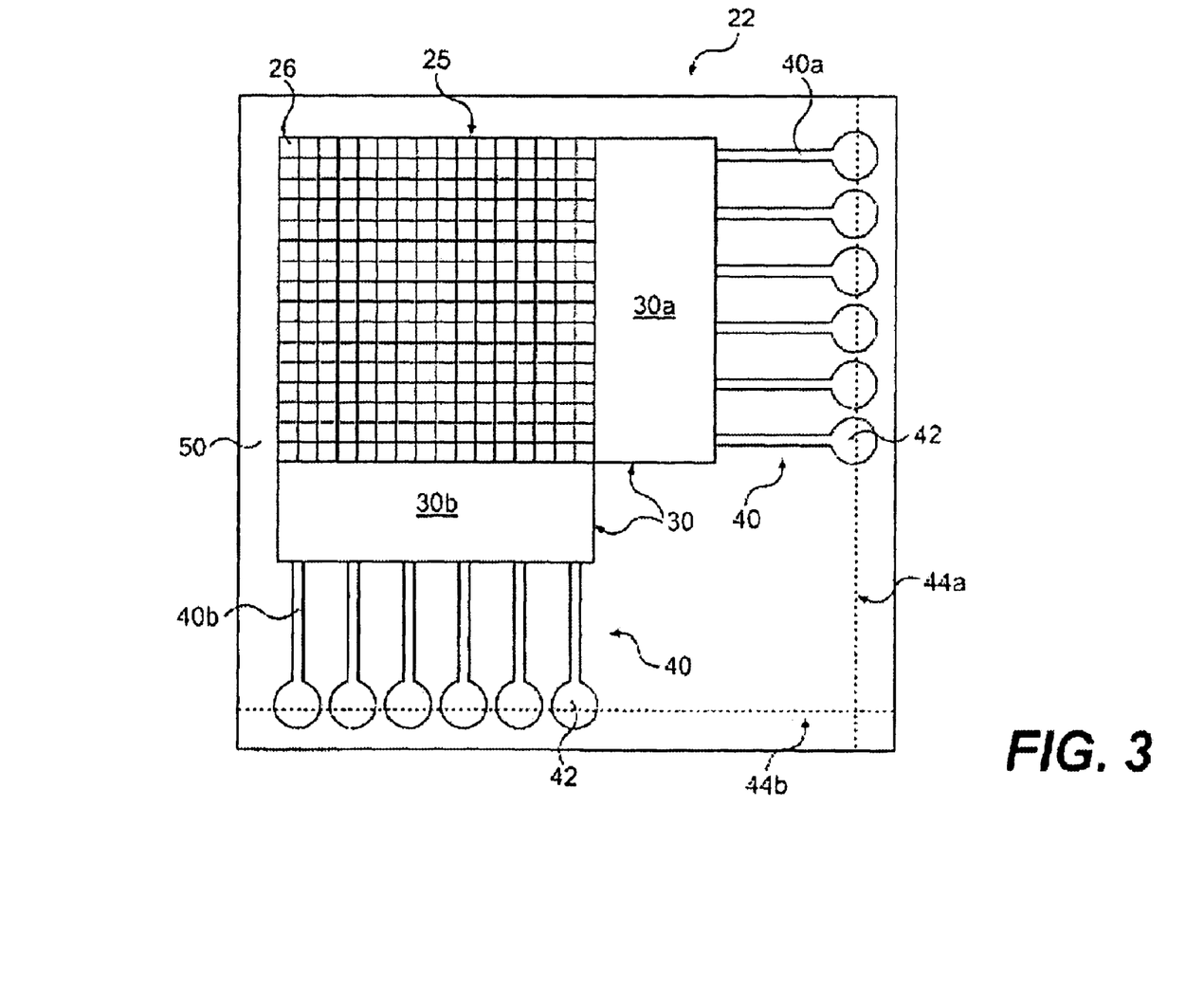
FIG. 3 is a simplified plan view of the memory module layer prior to assembly into the memory module.

Referring to FIGS. 1–3, each of the layers 22 comprises a memory array 25 or multiple arrays or a portion of an array, and multiplexing (mux) circuits 30 formed on a substrate 50. The memory array 25 comprises a matrix of memory elements 26. The mux circuits 30 comprise row and column mux circuit portions 30a and 30b, respectively, that are positioned adjacent respective orthogonal edges of the memory array 25. Input/output (I/O) leads 40 are also formed on the substrate 50 during the fabrication process. In the memory module 20, row I/O leads (40a) extend from the row mux circuit 30a to a first adjacent edge 44a of the substrate 50, and column I/O leads (40b) extend from the column mux circuit 30b to a second adjacent edge 44b of the substrate 50. Each of the leads 40 terminate at respective contact pads 42, portions of which are exposed at the edges 44a and 44b of the substrate 50.

A plurality of the layers 22 are stacked in the same orientation (FIG. 2) and laminated together (FIG. 1) to form the memory module 20. In one embodiment, the memory module 20 comprises 16 to 32 layers. Electrical contact is made to the exposed portions of the contact pads 42 of the stacked layers by conductive contact elements 55, which are illustrated in partial cut-away view in FIG. 1. The contact elements 55 extend along sides of the memory module 20, transverse to the plane of the individual layers 22. Each contact element 55 as illustrated makes electrical contact to a respective contact pad 42 of a plurality of the layers 22 in the stack. The contact elements 55 can be used to couple the memory module 20 to other components of a memory system.

The substrate 50 for each of the layers 22 may be formed from a thin inexpensive material such as a plastic (e.g., polyimide, polyester) or metal (e.g., stainless steel), for example. The memory array 25 and the mux circuits 30 may be formed according to a metal-semiconductor-metal (MSM) process on the substrate 50, for example. The MSM process results in two patterned layers of conductive metal circuits with one or more layers of semiconductor material (possibly incorporating metal and/or dielectric) in between. Where the metal layers cross and make contact to opposed sides of the semiconductor layer, a diode junction is formed between the metal layers.

Organic and inorganic materials may be used for the semiconductor layer. Inorganic materials include amorphous silicon and germanium materials, for example, and the use of such materials in similar applications is known in the field of photovoltaic cells. Inorganic semiconductor materials may be preferred because of their ability to be processed at lower temperatures that are more compatible with formation on a plastic substrate. For example, a polyimide substrate material may be able to withstand processing at temperatures up to about 300° C., while other possible substrate materials such as polyethylene napthalate (PEN) and polyethylene terephthalate (PET) are limited to maximum processing temperatures of about 130–150° C. Thus, the choice of semiconductor material for a given application may depend upon the selected substrate material. In general, a semiconductor material that can be processed (e.g., deposited and patterned, if necessary) at a temperature of less than about 150° C. will be compatible with most suitable substrates.

Examples of organic materials that may be employed as semiconductor layers in the memory module include a bi-layer consisting of copper pthalocyanine (CuPc) with PTBCI (3,4,9,10-perylenetetracarbonxilic-bis-benzimidazole). Other candidate materials that may be used in conjunction with CuPc are: PTCDA (3,4,9,10-perylenetetracarboxilic danhydride); and BTQBT [(1,2,5-thiadiazolo)-p-quinobis(1,3-dithiole)]. Layers can also be made from: TPD (N,N'-diphenyl-N,N'-bis(3-methylphenyl) 1–1'biphenyl-4,4'-diamine); α-NPD (4,4'-bis[N-(1-napthyl)-N-phenyl-amino]biphenyl); and TPP (5,10,15,20-tetraphenyl-21H,23H-porphine). Other materials may also be employed for the memory module 20 as will be apparent to those skilled in the art.

The memory array 25 is formed on each of the layers 22 in the memory module 20. The memory array 25 comprises a matrix of row and column lines, or electrodes, with a memory element 26 at each cross-point, or column/row intersection. The memory array 25 may comprise, for example, 8,192 row lines and 8,192 column lines. However, more or less row and column lines may be used in the memory array 25.

Figure 4A:
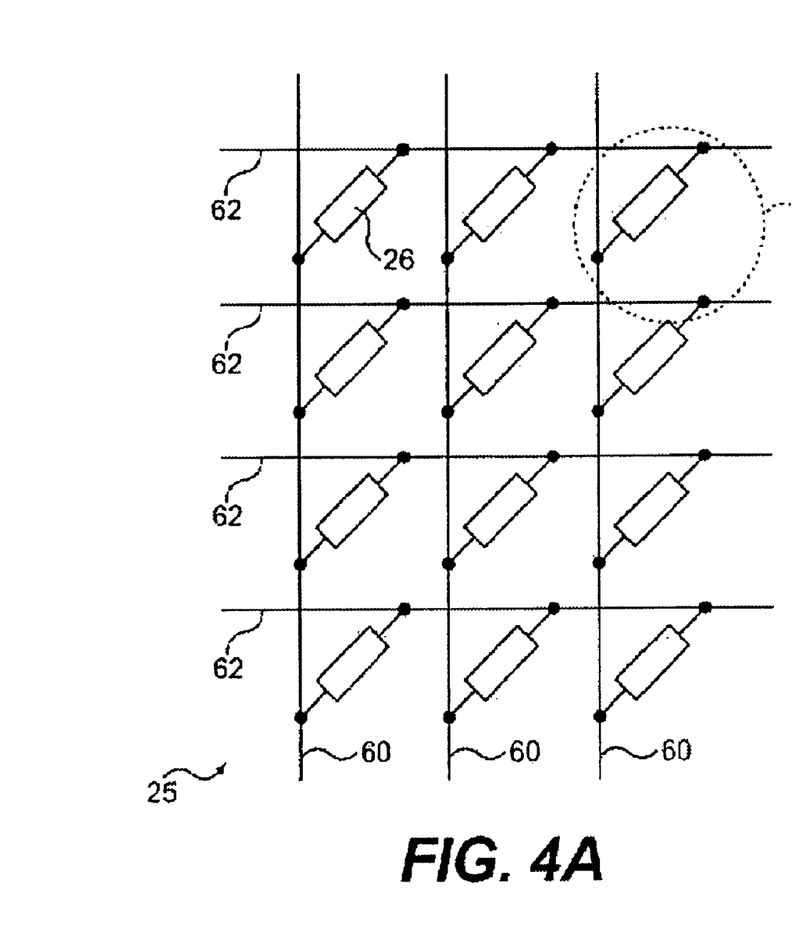
FIG. 4A is a diagram of a cross-point memory element.
Figure 4B:
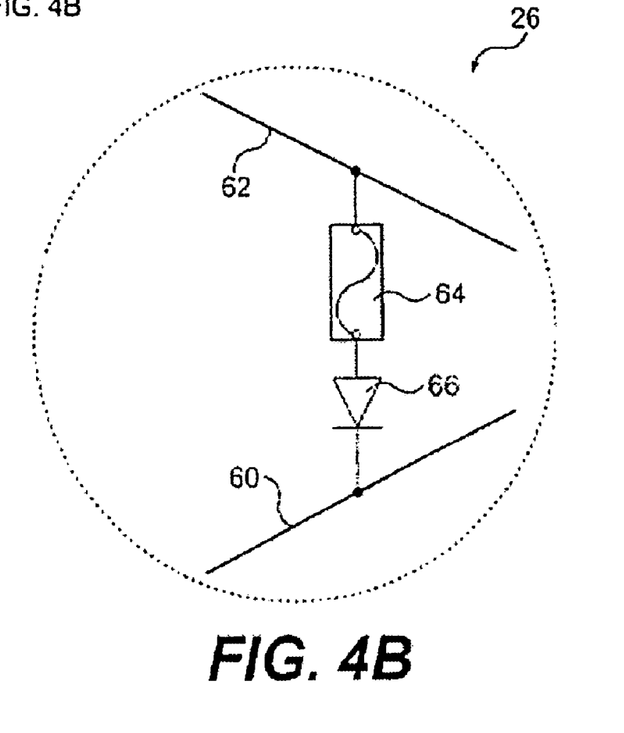
FIG. 4B is an expanded portion of the diagram of FIG. 4A.

FIGS. 4A and 4B illustrate a schematic diagram of a portion of the memory array 25 having column lines 60 and row lines 62. Coupled between each of the column lines 60 and row lines 62 is a memory element 26, which is shown in greater detail in FIG. 4B, which is an expanded portion of the diagram of FIG. 4A. Each memory element 26 schematically comprises a fuse element 64 coupled in series with a diode 66, although in practice the fuse and diode functions may be provided by the same element. The fuse element 64 provides the actual data storage effect of the memory element 26, while the diode 66 facilitates addressing of the memory element 26 using the row lines 62 and column lines 60 for writing and reading data.

The operation of the memory array 25 is as follows. At fabrication, each of the memory elements 26 has a fuse element 64 that is conductive. The conductive state of the fuse element 64 represents one binary data state, for example, a data "0". In order to write data to the memory array 25, each memory element 26 in which it is desired to store a data "1" is addressed using the column and row lines and the fuse element 64 therein is "blown," placing the fuse in a non-conductive state. The non-conductive state of the fuse element 64 represents the other binary data state, in the example a data "1". Blowing the fuse element 64 is, in most cases, a one-time operation, which makes the memory a "write-once" storage. A data writing operation (e.g., writing a data "1" to a selected memory element) can be performed by applying a predetermined current through a selected row line 62 to a selected column line 60, for example, sufficient to blow the fuse element 64 of the memory element 26 that directly interconnects the selected row line 62 and the selected column line 60. Data can be read from the memory array 25 by addressing memory elements 26 using the column lines 60 and the row lines 62 and sensing which memory elements 26 are conductive (data "0"s) and which are nonconductive (data "1"s). More generally, the binary data states of memory elements 26 are distinguished by some ratio between "conductive" resistance and "non-conductive" resistance.

Although the above description refers to fuse elements 64 in the memory array 25 that are fabricated in a low resistance state and blown to create a high resistance state, the memory array 25 may alternatively use "anti-fuse" elements that operate in the opposite manner. In that case, the memory elements 26 are fabricated in a high resistance state, and blown to create a short circuit to form a low resistance. The anti-fuse element in each memory element 26 is also formed in series with a diode 66 for the reasons mentioned above. The diode 66 and anti-fuse element are separate elements in this case, since the diode function is required after the anti-fuse has been blown to facilitate addressing of the memory element 26 using the row lines 62 and column lines 60 for writing and reading data.

The resistance of the fuse (or anti-fuse) element 64 changes irreversibly from a high state to a low state (or from a low state to a high state) at some critical current threshold. The change in resistance may be substantial, typically several orders of magnitude. The critical current threshold may be dependent on the area of the memory element 26. The area of the memory element 26 may be determined by the area of intersection of a row line 62 and a column line 60 or may be lithographically defined. The fuse element 64 and diode 66 can be formed from a number of thin films deposited in series between a row line 62 and a column line 64. The fuse and diode layers may be patterned by a number of means such as, for example, laser ablation, photolithography and soft lithography, to minimize cross talk between individual memory elements 26.

The diode 66 assists in addressing the memory elements 26 uniquely using the column lines 60 and row lines 62 for writing and reading data. The diode 66 forms a one-way conduction path through each memory element 26 so that a single column line 60 and single row line 62 can be used to uniquely address a single memory element 26. In other words, forming a circuit from one row line 62 to one column line 60 permits current to pass through only a single memory element 26. By applying a predetermined "data writing" current through the circuit, the fuse element 64 in the memory element 26 can be blown to change a data "0" to a data "1". Also, by sensing the resistance in the circuit it is possible to determine whether the memory fuse element 64 is blown or intact, thereby reading a data "1" or data "0".

Figure 5:
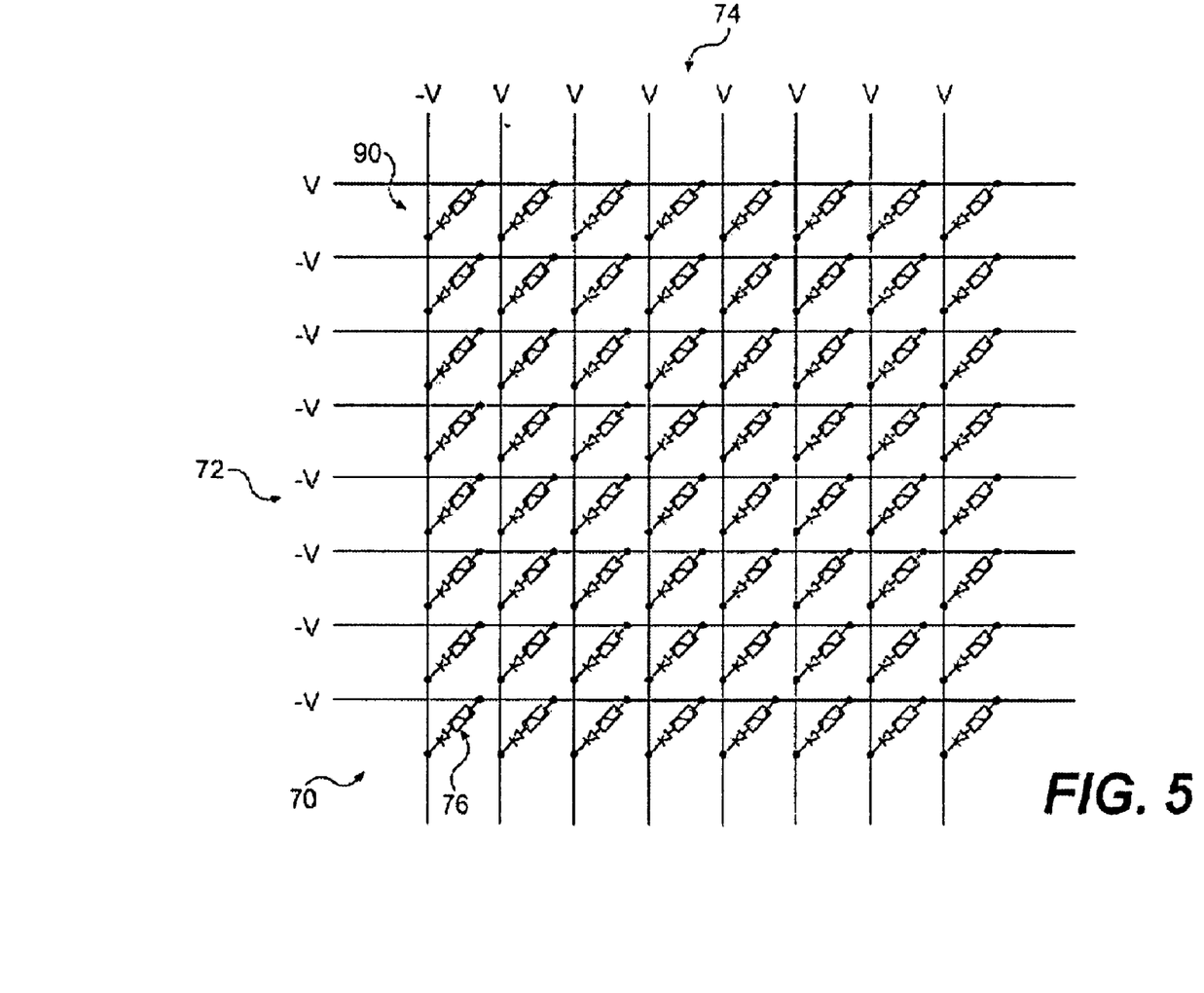
FIG. 5 is a diagram of a write-once memory array for illustration of addressing memory elements thereof.

FIG. 5 is a schematic representation of a cross-point write-once diode memory array. FIG. 5 shows an eight row by eight column array 70 with memory elements 76 at cross-points of the array 70, where each memory element 76 includes a diode and a fuse element. If voltages are applied to the row lines 72 and the column lines 74 as shown (i.e., all the column lines 74 are at a potential V except for one which is at −V, and all the row lines 72 are at a potential −V except for one which is at V), then only the diode of one memory element 76 will be forward biased. For the case shown in FIG. 5 only the diode of the memory element 76 in the upper left corner 90 of the array 70 will be forward biased. The diodes of the memory elements 76 in the top row and left-most column of the array 70 will have no bias on them and the remaining diodes of the memory elements 76 in the array 70 will be reverse biased, constituting an addressing scheme for the array 70.

If a current flows between a row line 72 and a column line 74, then the fuse of the memory element 76 at the cross-point of the row line 72 and the column line 74 is intact (e.g., representing a data "0"). Conversely, if no current flows between a row line 72 and a column line 74, then the fuse of the corresponding memory element 76 has been blown (e.g., representing a data "1"). By modulating the amplitudes of the voltages applied to the lines in the array 70, more current can be made to flow through the diode of the selected memory element 76. If the voltage produces a current that exceeds the threshold current of the fuse, then the fuse may blow, changing the state of the memory element 76 and constituting a method for writing to the array 70.

The actual current required to blow a fuse in the array 70 (or the voltage to be applied to achieve that current) may be predictable and controllable at the time of fabrication of the memory element 76. The applied voltage/current at which the fuse of a memory element 76 will blow can be adjusted by varying the current density through the memory element 76. For example, reducing the cross-sectional area of the intersection of the cross-point of row and column lines will reduce the current/voltage required to be applied to reach the critical current density to blow the fuse. This scheme can be used in the design and fabrication of the array 70 to ensure that voltages can be applied to blow only the fuse of the desired memory element 76.

In conventional cross-point memory arrays, the state of an addressed memory element is determined by the current that flows through a sense line to a suitably chosen bias point. In order for current to pass through the sense line, two conditions must be met: (1) the memory element must be addressed, and (2) the fuse element of the memory element must be in the high resistivity state. If the diode is not addressed, a corresponding row and/or column sense diode will not be forward biased and will not conduct current. Therefore, if a single sense line is connected to all the row (or column) lines and one memory element in the row and column array is addressed, then the state of that memory element can be unambiguously determined.

Figure 6:
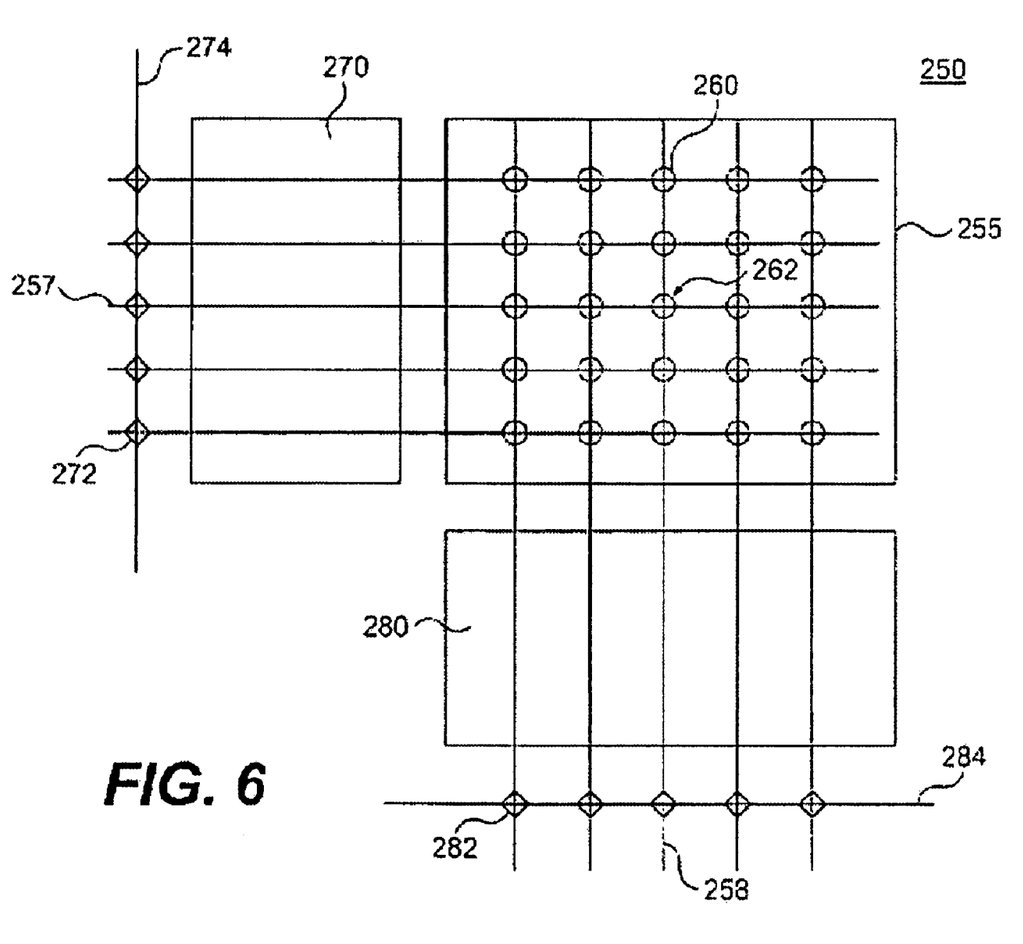
FIG. 6 is a schematic diagram of a circuit for the memory array using a diode sensing method.

FIG. 6 shows a schematic diagram of a circuit 250 for a cross-point memory array 255 using the conventional diode sensing method described above. The memory array 255 may comprise 8,192 row lines 257 and 8,192 column lines 258. A plurality of memory elements 260 are illustrated, coupled to their respective row and column addressing circuits 270, 280 that are constructed to address the memory array. The circuit 250 also includes a row sense line 274 and a column sense line 284. The row sense line 274 is coupled to each of the 8,192 row lines through respective row sense diodes 272. In particular, each row sense diode 272 has its anode coupled to the corresponding row line and its cathode coupled to the row sense line 274. Similarly, column sense diodes 282 are coupled from the column sense line 284 to the respective 8,192 column lines of the memory array. The cathodes of diodes 282 are coupled to the respective column lines, and the anodes thereof coupled to the column sense line 284.

In the example as shown in FIG. 6, a center memory element 262 is addressed when the row line 257 and the column line 258 corresponding to the memory element 262 are selected by the addressing circuits 270, 280. Voltage/current is applied to the row lines 257 and the column lines 258 by power supply units (not shown). If the fuse of memory element 262 is blown then no current may flow through the memory element 262. Therefore, a sense current applied to the corresponding row line 257 and corresponding column line 258 will flow through both corresponding sense diodes 272, 282, respectively and in both the row and column sense lines 274, 284, respectively. If the fuse of the memory element 262 is intact, then the sense current will flow through the memory element 262 and no current will flow in either sense line 274, 284 regardless of the state of the fuses in any other memory elements in the array 255. Therefore, no sense current will flow through the sense diodes 272, 282 corresponding to the addressed memory element 262. The addressing scheme ensures that the corresponding sense diodes of the unselected memory elements will be reverse biased.

The circuit design of FIG. 6 presents difficulties in sensing the state of the addressed memory element 262. Each of the 8,192 row lines 257 is connected to a separate row sense diode 272, and each row sense diode 272 is connected to a single row sense line 274. The sense diodes 272 for the unaddressed row lines are reverse biased as described above and only the sense diode for the addressed row line is forward biased. The 8,191 reverse biased sense diodes will often leak current into the row sense line 274. Therefore, because the direction of the cumulative leakage current is opposite the direction of the sense current, the reverse leakage current will overwhelm the sense current and detecting the sense current is difficult. A similar problem exists for the column sense line 284 with respect to the column sense diodes 282 and the column lines 258.

Figure 7:
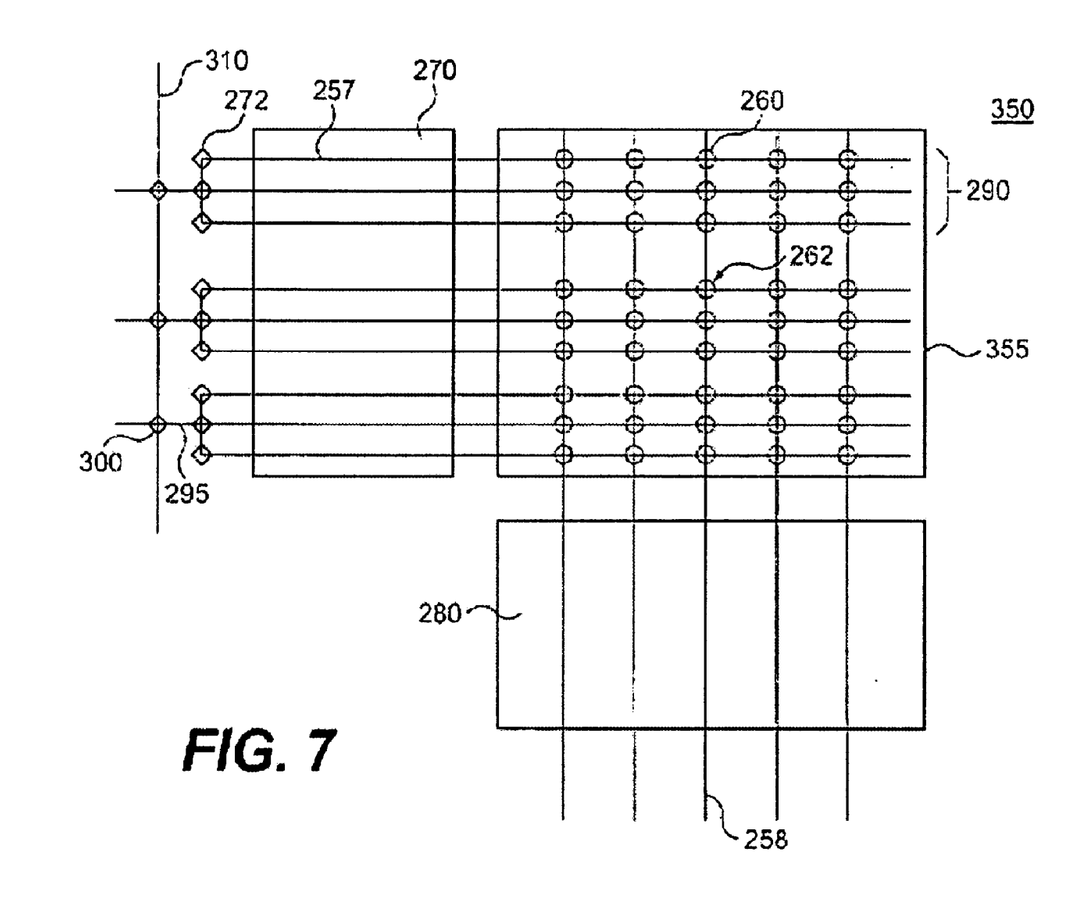
FIG. 7 is a schematic diagram of a circuit for the memory array using a diode decoupled sensing method.

FIG. 7 shows a schematic diagram of a circuit 350 for a cross-point memory array 355 using a diode decoupled sensing method. The circuit shown in FIG. 7 is identical in structure and operation to the circuit shown in FIG. 6, except for the following differences.

In FIG. 7, the row lines 257 are grouped together in stripes 290 comprising 512 lines each. Therefore, the 8,192 row lines in the memory array 355 are grouped into 16 row stripes 290. However, more or less lines may be grouped into each stripe 290 to produce a lesser or greater number of stripes. Each row stripe 290 is coupled to a separate sense line segment 295. The sense line segment 295 for each row stripe 290 is electrically separate from sense line segments of the other 15 row stripes 290. Each row sense diode 272 in a row stripe is connected in parallel to each sense line segment. Each sense line segment 295 is coupled in series to a sense diode 300, and all of the sense diodes 300 for the row stripes 290 are coupled to a sense bus 310. The voltage levels for the power supply units used to generate current on the row lines 257 are adjusted to account for the addition of the sense diodes 300.

Leakage current from the unaddressed row lines 257 flow into the sense bus 310 through only 15 sense diodes 300, as compared to 8,191 sense diodes 272 in the conventional diode sensing method illustrated in FIG. 6. Therefore, the overall effect of the leakage current in hiding the sense current is reduced and a wider margin for detecting the sense current is provided.

Due to the wider margin for detecting the sense current, having a redundant sense line for the column lines 258 may be unnecessary. Therefore, greater freedom and versatility in designing the circuit 350 is provided. However, both row and column sense lines may be used to further improve signal detection in the memory array.

While the present invention has been described in connection with an exemplary embodiment, it will be understood that many modifications will be readily apparent to those skilled in the art, and this application is intended to cover any variations thereof.

What is claimed is:

1. A memory storage device, comprising:
   a cross-point memory array, wherein the cross-point memory array comprises a first and second set of transverse electrodes that intersect at a plurality of cross-points;
   a memory element at each cross-point, wherein each memory element is switchable between a low and a high impedance state;
   address decoding circuitry coupled to the first and second set of transverse electrodes;
   striping circuitry coupled to the first set of transverse electrodes, wherein the electrodes of the first set of transverse electrodes are grouped together to form a set of stripes;
   a plurality of sense line segments, wherein each sense line segment is coupled to a separate stripe by a diode; and
   a sense bus coupled to each diode.

2. The memory storage device of claim 1, where the memory element is switchable between a low and a high impedance state by application of a write signal in the form of a predetermined current density through the memory element.

3. The memory storage device of claim 1, where the address decoding circuitry comprises a first and second set of input lines for addressing the first and second set of transverse electrodes, respectively.

4. The memory storage device of claim 1, where the memory element comprises a diode and a fuse element, wherein the fuse element may convert from an electrically conductive state to an electrically non-conductive state.

5. The memory storage device of claim 1, where the memory element comprises a diode and an anti-fuse element, wherein the anti-fuse element may convert from an electrically non-conductive state to an electrically conductive state.

6. The memory storage device of claim 1, where the memory element comprises two layers of conductive material and one or more layers of semiconductor material in between the two layers of conductive material.

7. The memory storage device of claim 6, where the two layers of conductive material comprise patterned layers of conductive metal circuits.

8. The memory storage device of claim 6, where the semiconductor material comprises inorganic materials.

9. The memory storage device of claim 8, where the inorganic materials comprise one of amorphous silicon and germanium.

10. The memory storage device of claim 6, where the semiconductor material comprises organic materials.

11. The memory storage device of claim 10, where the organic materials comprise one of copper pthalocyanine (CuPc), PTBCI (3,4,9,10-perylenetetracarbonxilic-bis-benzimidazole), PTCDA (3,4,9,10-perylenetetracarboxilic danhydride), BTQBT [(1,2,5-thiadiazolo)-p-quinobis(1,3-dithiole)], TPD (N,N'diphenyl-N,N'-bis(3-methylphenyl) 1–1'biphenyl-4,4'-diamine), α-NPD (4,4'-bis[N-(1-napthyl)-N-phenyl-amino]biphenyl) and TPP (5,10,15,20-tetraphenyl-21H,23H-porphine).

12. The memory storage device of claim 1, where the cross-point memory array is formed on a dielectric substrate material.

13. The memory storage device of claim 12, where the dielectric substrate material comprises one of a polymeric material and a metal film having a coating of dielectric material thereon.

14. The memory storage device of claim 1, where the first and second set of transverse electrodes each comprise 8,192 electrodes.

15. The memory storage device of claim 1, where the set of stripes comprises 16 stripes.

16. A memory module comprising a plurality of module layers each having a memory storage device as defined in claim 1.

17. A memory storage device, comprising:
   a cross-point memory array, wherein the cross-point memory array comprises a first and second set of transverse electrodes that intersect at a plurality of cross-points;
   a memory element at each cross-point, wherein each memory element is switchable between a low and a high impedance state;
   address decoding circuitry coupled to the first and second set of transverse electrodes;
   striping circuitry coupled to the first set and second set of transverse electrodes, wherein the electrodes of the first set and second set of transverse electrodes are grouped together to form a first and second set of stripes;
   a plurality of sense line segments, wherein each sense line segment is coupled to a separate stripe of the first and second set of stripes by a diode; and
   a first sense bus coupled to each diode coupled to the stripes of the first set of stripes and a second sense bus coupled to each diode coupled to the stripes of the second set of stripes.

18. A memory module comprising a plurality of module layers each having a memory storage device as defined in claim 17.

19. A method for sensing the state of a memory element in a memory storage device, comprising:
   (a) coupling striping circuitry to a first set of transverse electrodes, whereby the electrodes of the first set of transverse electrodes are grouped together to form a set of stripes;
   (b) generating a current along a selected electrode corresponding to the memory element; and
   (c) detecting whether the current flows in the selected electrode.

20. The method of claim 19, where the coupling step comprises:
   coupling a plurality of sense line segments to the set of stripes, wherein each sense line segment is coupled to a separate stripe by a diode; and
   coupling a sense bus to each diode.

* * * * *